(12) United States Patent
Ishibashi et al.

(10) Patent No.: US 7,030,417 B2
(45) Date of Patent: Apr. 18, 2006

(54) SEMICONDUCTOR LIGHT EMITTING DEVICE AND FABRICATION METHOD THEREOF

(75) Inventors: Akihiko Ishibashi, Osaka (JP); Toshiya Yokogawa, Nara (JP); Kiyoshi Ohnaka, Sakai (JP); Susumu Koike, Kawachinagano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 174 days.

(21) Appl. No.: 10/633,040

(22) Filed: Aug. 4, 2003

(65) Prior Publication Data

US 2004/0021147 A1   Feb. 5, 2004

(30) Foreign Application Priority Data

May 15, 2002 (JP) ............................. 2002-139609
May 15, 2003 (JP) ....................... PCT/JP03/06041

(51) Int. Cl.
*H01L 21/00* (2006.01)

(52) U.S. Cl. ............................. 257/79; 257/76; 257/78; 257/85

(58) Field of Classification Search ................. 257/103
See application file for complete search history.

(56) References Cited

U.S. PATENT DOCUMENTS 6,335,546 B1 * 1/2002 Tsuda et al. .................. 257/94

FOREIGN PATENT DOCUMENTS

| EP | 1 104 031 A2 | 5/2001 |
| EP | 1 280 190 A1 | 1/2003 |
| JP | 11-186600 | 7/1999 |
| JP | 2001-203385 A | 7/2001 |
| JP | 2002-204035 A | 7/2002 |

* cited by examiner

*Primary Examiner*—Thao P. Le
(74) *Attorney, Agent, or Firm*—McDermott Will & Emery LLP

(57) ABSTRACT

The present invention relates to a semiconductor light emitting device comprising a sapphire substrate 11; a u-GaN layer 12 that is formed on top of the substrate 11 and that comprises a plurality of concave portions 121 formed into band-like shapes with predetermined intervals therebetween; a regrown u-GaN layer 13 formed on the u-Ga layer 12; a layered structure that is formed on the u-GaN layer 13 comprises an n-GaN layer 15, an active layer 16, and a p-GaN layer 19; an n-type electrode 24 formed on the n-GaN layer 15 exposed by removing a potion of the layered structure; and a transparent p-type electrode 20 formed on the p-GaN layer 19, wherein the p-type electrode 20 is an emission detection surface, and an air layer S is formed between the bottom surface of the u-GaN layer 13 and the concave portions 121.

8 Claims, 8 Drawing Sheets

SEMICONDUCTOR LIGHT EMITTING DEVICE AND FABRICATION METHOD THEREOF

TECHNICAL FIELD

The present invention relates to semiconductor light emitting devices such as light emitting diodes, which are usable as displays, luminaries, and in the field of optical information processing, etc.; and to a fabrication method thereof.

BACKGROUND ART

Semiconductors that contain nitrogen (N) as the Group V element are excellent candidates as useful materials for short-wavelength light emitting devices because of their wide band gap. Among these, extensive research has been conducted on gallium nitride based compound semiconductors (GaN based semiconductors: AlGaInN), and blue and green light emitting diodes (LED) have already been put to practical use.

FIG. 8 is a cross-sectional view showing a currently in use GaN based ultraviolet light emitting diode. The light emitting diode is fabricated in the manner as described below wherein "u-" stands for undoped, "p-" stands for p-type, and "n-" stands for n-type:

First, a u-GaN seed crystal 42 is grown on a sapphire substrate 41 using metalorganic vapor phase epitaxy (MOVPE) techniques. Next, $SiO_2$ is deposited by chemical vapor deposition (CVD) or the like on the seed crystal 42. Subsequently, the $SiO_2$ layer is processed by photolithography and etching to form dielectric masks 54 with a stripped pattern. Then, to obtain a flat surface, u-GaN 43 is regrown by an epitaxial lateral overgrowth (ELO) technique from starting points at portions of the seed crystal 42 that are exposed through dielectric masks 54. In this case, as the growing method, MOVPE techniques, hydride vapor phase epitaxy (HVPE) techniques, and the like may be employed. Subsequently, an n-GaN contacting layer 44, u-GaN 45, InGaN active layer 46, p-AlGaN gap layer 47, and p-GaN contacting layer 48 are sequentially deposited.

A mask having a predetermined shape is then formed on the surface of the p-GaN contacting layer 48, and then etched to expose a portion of the n-GaN contacting layer 44. Then, a transparent p-type electrode 49 is formed on the p-GaN contacting layer 48, and on the exposed portion of the n-GaN contacting layer 44, an n-type electrode 53 is formed. Finally, on the p-type electrode 49, a base electrode 50 is positioned and a gold wire 52 is bonded to the base electrode 50 via a solder ball 51. In the same manner, a solder ball 51 and gold wire 52 are also attached to the n-type electrode 53.

In this light emitting diode, the p-type electrode 49 is formed from a transparent and conductive thin film, wherein the p-type electrode 49 thereof becomes an emission detection surface by applying current from the base electrode 50 to the entire surface of the p-type electrode 49. By making the p-type electrode 49 side to be the emission detection surface, wire bonding becomes possible. As a result, compared to a face-down mounting method, wherein bonding is conducted on the p-type electrode side by turning the device upside-down, this method is advantageous in that the device can be miniaturized and there is no need for accurate alignment, improving productivity.

As a substrate for GaN based crystal, sapphire, SiC, NGO, etc., are used; however, none of these substrates have the lattice constant that matches that of GaN, making it difficult to obtain coherent growth. Therefore, in a GaN layer that has been grown on such a substrate, a large number of dislocations (edge dislocations, screw dislocations, mixed dislocations) exist. For example, when a sapphire substrate is used, there exist approximately $1 \times 10^9$ $cm^{-2}$ dislocations. These dislocations decrease luminous efficiency of an ultraviolet light emitting diode.

As a method for decreasing the dislocation density, the above-described light emitting diode employs the epitaxial lateral overgrowth technique to deposit a GaN layer. This method is effective in decreasing the number of threading dislocations in a system having a large lattice mismatch.

FIG. 9 is a partial enlarged view of FIG. 8 schematically showing the distribution of the dislocations in a GaN crystal that has been obtained by ELO. As shown in this figure, in the u-GaN layer 43, a large number of dislocations exist in the region $X_1$ located above the seed crystal 42, wherein the dislocation density thereof is approximately $1 \times 10^9$ $cm^{-2}$. In contrast, the region $X_2$ located on the dielectric mask 54 has fewer dislocations, wherein the dislocation density thereof is decreased to approximately $1 \times 10^7$ $cm^{-2}$. In this GaN crystal, the width of the dielectric mask 54 is approximately 4 µm and the interval therebetween is approximately 12 µm. As described above, employing ELO makes it possible-to form a crystal on the dielectric mask 54 that has a low dislocation density, reducing the crystal defects and improving the luminous efficiency of the ultraviolet light emitting diode. An example of a semiconductor light emitting device that has a region of low dislocation density, other than that described above, is disclosed in the specification of the European Patent Publication No. 1104031.

However, a light emitting diode having such a structure, in which the emission detection surface is on the p-type electrode side, renders a problem in that light from the active layer cannot be effectively emitted because the emission light to the n-type electrode, located opposite the p-type electrode, scatters or is absorbed.

In order to solve this problem, a light emitting device that incorporates a reflecting mirror called a Bragg reflecting mirror therein is proposed. In this light emitting device, light that travels from the active layer toward the n-type electrode is reflected outside the device by the reflecting mirror. However, even in this structure, the luminous efficiency is not satisfactory. Furthermore, because it requires a step to incorporate a reflecting mirror, this structure has a drawback in that the fabrication process becomes complicated.

The present invention aims at solving the above drawbacks and providing a semiconductor light emitting device that comprises a p-type electrode serving as an emission detection surface and that achieves high luminous efficiency; and providing a method for fabricating the same.

DISCLOSURE OF THE INVENTION

In order to solve the above problems, the semiconductor light emitting device of the present invention comprises: a substrate; a first GaN based semiconductor layer that is formed on the substrate and that includes on top thereof a plurality of concave portions formed into a band-like shape with a predetermined interval therebetween; a second GaN based semiconductor layer formed on the first GaN based semiconductor layer; a layered structure that is formed on the second GaN based semiconductor layer, comprising an n-type GaN based semiconductor layer, an active layer, and a p-type GaN based semiconductor layer; an n-type electrode that is formed on the n-type GaN based semiconductor layer on the portion where the layered structure is partially removed and become exposed; and a transparent p-type electrode that is formed on the p-type GaN based semiconductor layer; wherein the p-type electrode composes an emission detection surface, and an air layer is formed between the bottom surface of the second GaN based semiconductor layer and the concave portion.

Furthermore, in order to solve the above problems, the method for fabricating a semiconductor light emitting device comprises the steps of: forming a first GaN based semiconductor layer on a substrate; forming a plurality of band-like concave portions on top of the first GaN based semiconductor layer with predetermined intervals therebetween; forming a second GaN based semiconductor layer by epitaxial lateral overgrowth with the projecting portions between the concave portions as starting points, and thereby forming an air layer between the bottom surface of the second GaN based semiconductor layer and the concave portion; forming a layered structure comprising an n-type GaN based semiconductor layer, an active layer, and a p-type GaN based semiconductor layer on the second GaN based semiconductor layer; forming an n-type electrode on the n-type GaN based semiconductor layer that is exposed by removing a portion of the layered structure; and forming a transparent p-type electrode on the p-type GaN based semiconductor layer.

BEST MODE FOR CARRYING OUT THE INVENTION

Figure 1:
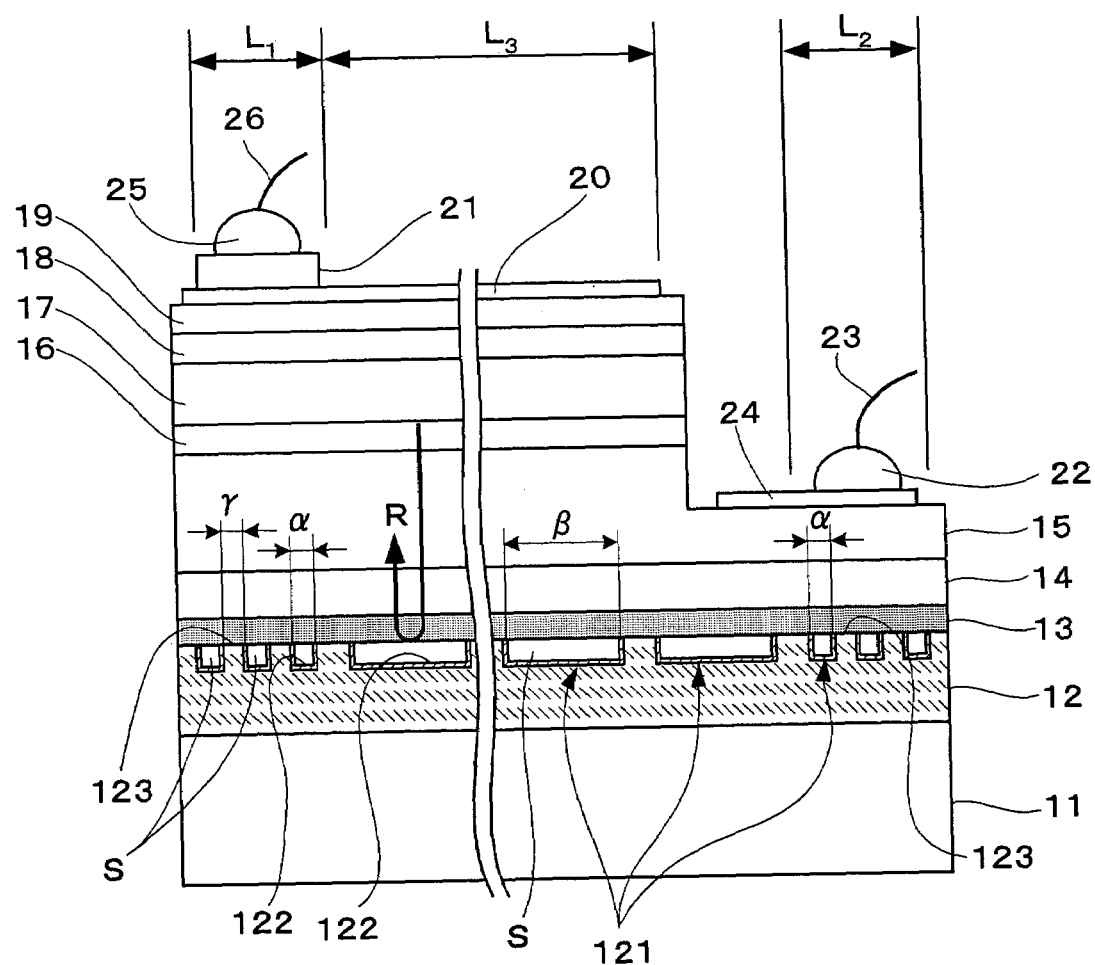
FIG. 1 is a cross-sectional view showing a semiconductor light emitting device according to one embodiment of the present invention.

Hereunder, a semiconductor light emitting device according to one embodiment of the present invention will be explained with reference to the drawings. FIG. 1 is a cross-sectional view of a light emitting diode of one embodiment of the semiconductor light emitting device according to the present invention. Note that, in the following explanation, "u-" indicates undoped, "p-" indicates p-type, and "n-" indicates n-type.

As shown in FIG. 1, this light emitting diode performs surface emission on a p-type electrode 20 that is disposed on the top surface. In this light emitting diode, a sapphire substrate 11 having, for example, a width of approximately 350 μm (length in the lateral direction in this figure) is used, and, on top of the substrate 11, a u-GaN seed crystal 12 is formed. On the top surface of the seed crystal 12, a plurality of band-like concave portions 121 are formed with predetermined intervals therebetween. In addition, on the top surface of the seed crystal 12, a u-GaN layer 13 is regrown. Thereby, between each of the bottom surfaces of the u-GaN layer 13 and the concave portions 121, an air layer S is formed. As described below, the width of the concave portions 121 positioned beneath the base electrode is narrower than that of those positioned beneath the p-type electrode 20 that performs surface emission. Furthermore, the bottom and the side surfaces of each concave portion 121 are covered with a mask layer 122 made of $Si_2N_4$.

On the u-GaN layer 13, a u-GaN layer 14 and n-GaN layer 15 are deposited. A portion of the n-GaN layer 15 is exposed and on the unexposed portion thereof, a u-GaN layer 16, an active layer 17 made of InGaN, a p-AlGaN layer 18, and a p-GaN layer 19 are successively deposited. On the exposed portion of the n-GaN layer 15, an n-type electrode 24 is formed and wire bonding is applied thereon. In other words, on the n-type electrode 24, a gold wire 23 is connected via a solder ball 22.

Furthermore, on substantially the entire surface of the p-GaN layer 19, the p-type electrode 20 is formed. The p-type electrode 20 is a transparent thin film, and, as described above, the p-type electrode 20 serves as an emission detection surface. The p-type electrode 20 is obtained by depositing or sputtering metals such as nickel (Ni), platinum (Pt), gold (Au), etc. In order to make it transparent, it is preferable that the thickness thereof be not less than 1 nm and not more than 100 nm. Similarly to the n-type electrode 19, wiring is applied to the p-type electrode 20 by wire bonding. However, the p-type electrode 20 is very thin and difficult to subject to direct wire bonding. Therefore, on a portion of the p-type electrode 20, a base electrode 21 made of Au is provided for wire bonding, and a gold wire 26 is connected via a solder ball 25 to the base electrode 21. As the base electrode 21 and n-type electrode 24 to which the wire bonding is applied exhibit light shield properties and do not transmit light, it is therefore preferable that the widths thereof be as small as possible, for example, approximately 50 μm.

As described above, the concave portions 121 positioned beneath the light-shielding portions of the base electrode 21 and n-type electrode 24 have widths and intervals different from those positioned beneath the emission detection surface. In other words, the concave portions 121 positioned beneath the light-shielding region $L_1$ where the base electrode 21 is formed and the light-shielding region $L_2$ where wire bonding is applied to the n-type electrode 24 have a smaller width than the other concave portions 121, i.e., those positioned beneath the region $L_3$ serving as an emission detection surface. The reason for this will be described in detail below; however, in brief, this is because the regions $L_1$ and $L_2$ have light shielding properties, and therefore, even when the dislocation density of the crystals below these region is high, it does not affect emission intensity; while it is necessary to enhance the mechanical strength of the structure of these crystals because wire bonding is applied to the regions $L_1$ and $L_2$. In contrast, it is necessary to make the dislocation density of the crystal positioned beneath the region $L_3$ low in order to enhance emission intensity, and therefore the width of these concave portions 121 is increased.

Given the above consideration, it is preferable that the width β of the concave portions 121 beneath the region $L_3$ be at least twice that of the width α of the concave portions 121 beneath regions $L_1$ and $L_2$. Preferable examples of the widths of the concave portions 121 include, for example, the width β of the concave portions 121 beneath the region $L_3$ being not less than 6 μm and not more than 20 μm, and more preferably not less than 9 μm and not more than 12 μm. In contrast, the width α of the concave portions 121 positioned beneath the regions $L_1$ and $L_2$ is preferably not less than 1 μm and not more than 6 μm, and more preferably not less than 2 μm and not more than 4 μm. Because the crystals beneath the regions $L_1$ and $L_2$ are required to have a structure having high mechanical strength, it is therefore preferable that the width γ of the projecting portions 123 formed between the concave portions 121 be not less than 1 μm and not more than 6 μm, and more preferably not less than 2 μm and not more than 4 μm.

Figure 2:
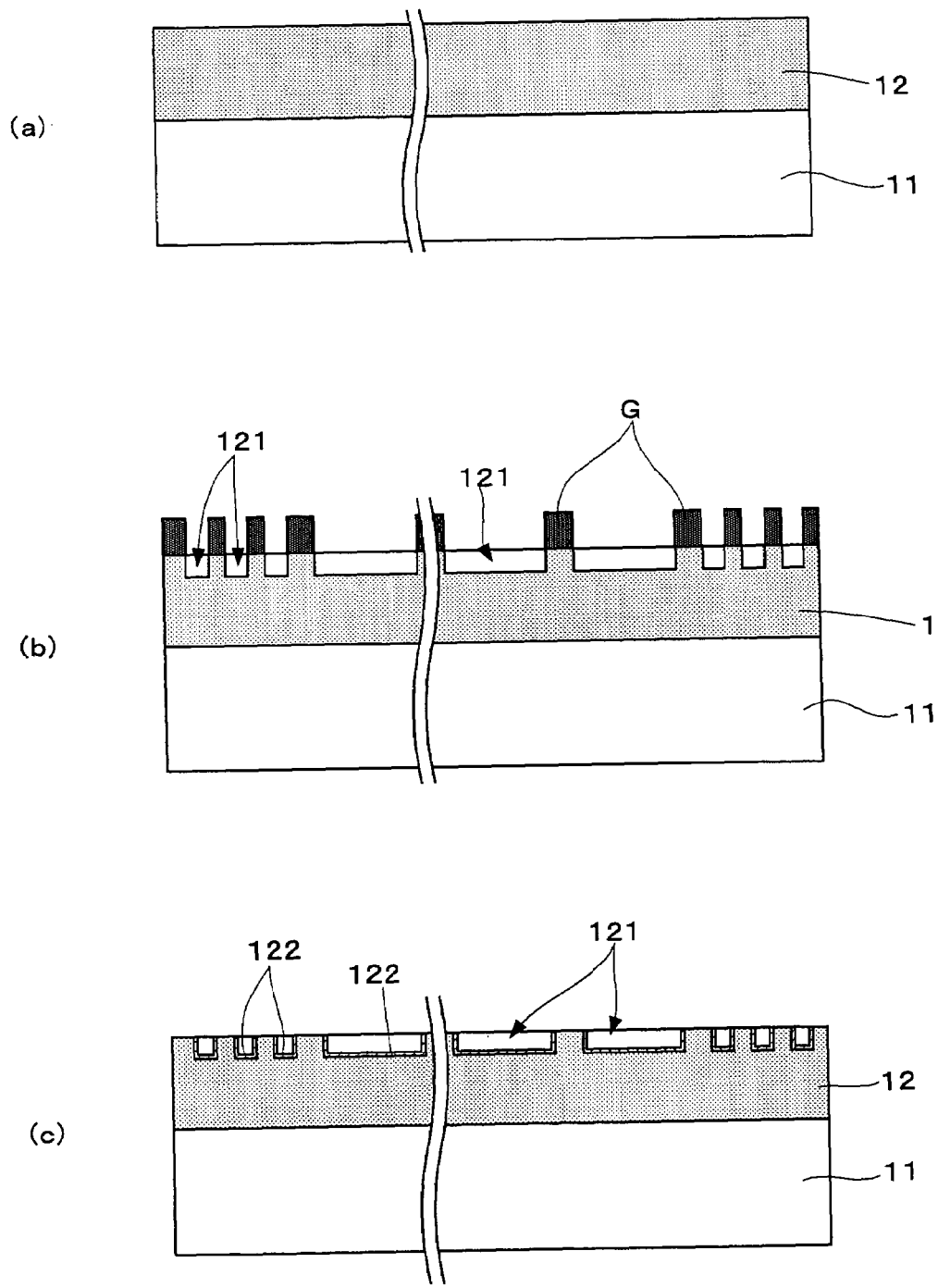
FIG. 2 is a diagram showing a fabrication method for the semiconductor light emitting device of FIG. 1.
Figure 3:
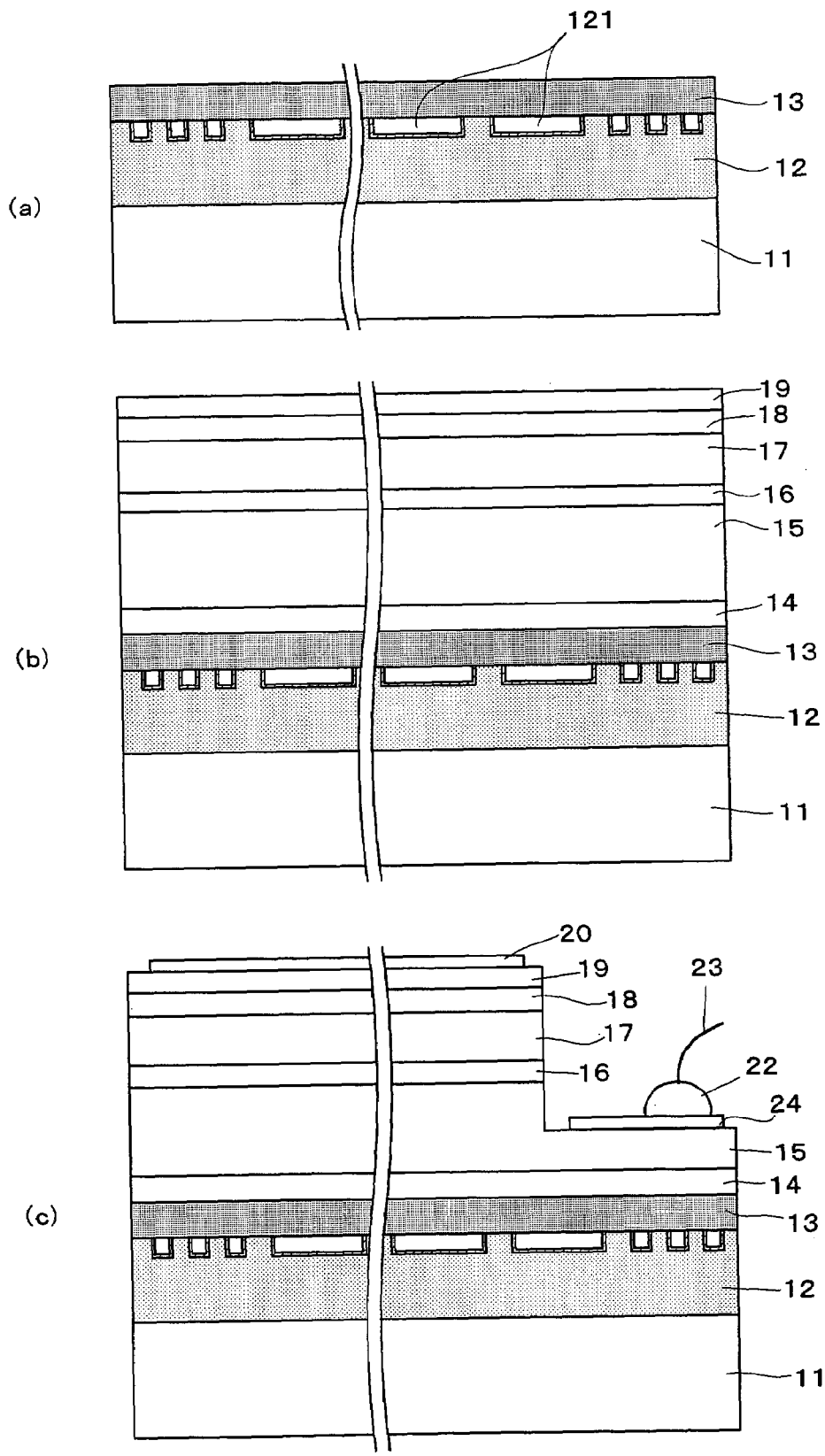
FIG. 3 is a further diagram showing a fabrication method for the semiconductor light emitting device of FIG. 1.

Next, methods for fabricating the light emitting diode will be explained with reference to FIG. 2 to FIG. 4. First, TMG and $NH_3$ are applied to a C-plane sapphire substrate 11 at approximately 500° C. to form an AlGaN buffer layer (not shown). Then, the temperature is raised to approximately 1,020° C. and TMG and $NH_3$ are supplied to form a u-GaN layer 12 having a thickness of approximately 1 μm as shown in FIG. 2(a). In this case, the principal plane (facing surface) is a C-plane.

Then, after applying a resist on the u-GaN layer 12, as shown in FIG. 2(b), the resist is processed by photolithography into a stripped pattern G that comprises a plurality of bands extending in the $<1-100>_{GaN}$ direction. Subsequently, the portions of the u-GaN layer 12 that are exposed through the stripped pattern G are subjected to a process to form the concave portions 121 by dry etching. At this time, it is preferable that the height-difference between the bottom surface of the concave portion 121 and the top surface of the u-GaN layer 12 be approximately 5,000 Å. The stripped pattern G is based on the widths and intervals of the thus formed concave portions 121.

Subsequently, after depositing an $Si_3N_4$ film (not shown) by the electron cyclotron resource (ECR) sputtering method, the stripped pattern G and the $Si_3N_4$ film formed thereon are removed by lift-off. Thereby, as shown in FIG. 2(c), a mask layer 122 composed of $Si_3N_4$ is formed on the bottom and side surfaces of the concave portion 121. Then, as shown in FIG. 3(a), using the exposed u-GaN layer 12 as a seed crystal, a u-GaN layer 13 is regrown by MOVPE technique.

Figure 4:
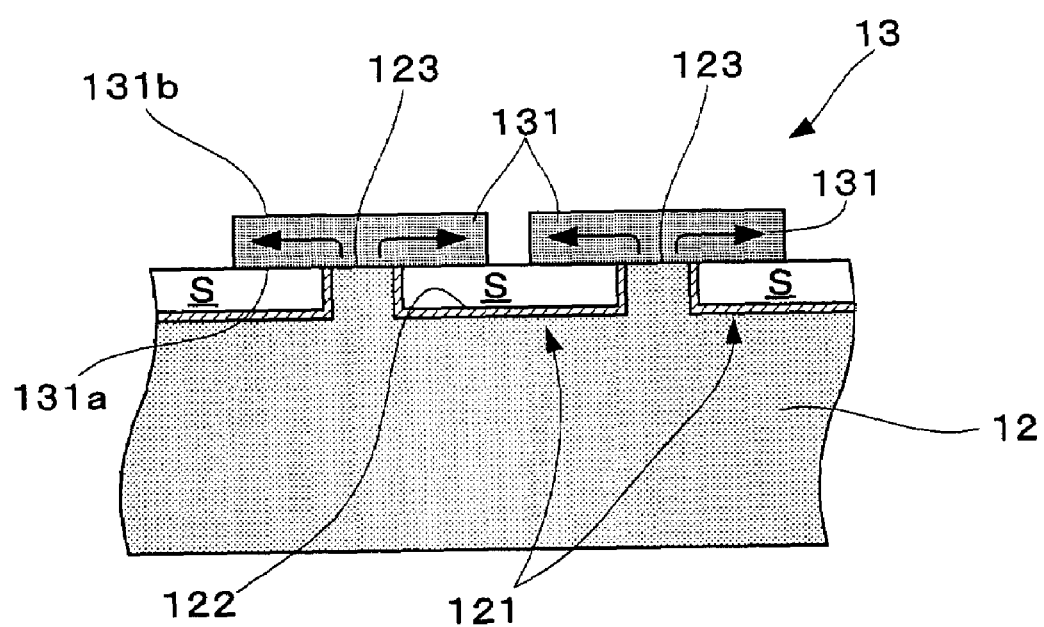
FIG. 4 shows the lateral overgrowth of a u-GaN layer in the semiconductor light emitting device of FIG. 1.

To be more specific, as shown in FIG. 4, the u-GaN layer 13 is regrown using the top surfaces of the projecting portions 123 that are formed between the concave portions 121, i.e., the principal plane (facing surface (C-plane)) of the u-GaN layer 12 as a seed crystal. The u-GaN layer 12, which serves as a seed crystal, is formed by the MOVPE technique, and therefore the principal plane thereof is mainly composed of Ga atoms. Therefore, when the u-GaN layer 13 is regrown from the top surfaces of the projecting portions 123, the u-GaN layer 13 first regrows in the c-axis direction, and then laterally grows with extending in the c-axis direction and a-axis direction (i.e., $<11-20>_{GaN}$ direction) using the C-plane and A-plane of the GaN, which was obtained by regrowing the u-GaN layer 13, as seed crystals. Thus, on projecting portions 123, wing regions 131 extending in the lateral direction are formed.

The bottom surface of the wing region 131, i.e., a plane 131a facing the concave portion 121, is mainly formed from an N atomic plane. On the N atomic plane, the crystal grows at an extremely slow speed compared to that of the opposite surface, i.e., the top surface 131b of the wing region 131 (Ga atomic plane). Therefore, substantially no crystal growth can be observed on the bottom surfaces of the wing regions 131.

Consequently, the wing region 131 grows in the upward and lateral directions. As a result, the ends of the adjacent wing regions 131 come in contact with each other, forming the u-GaN layer 13. Accordingly, beneath the wing regions 131, air layers S are formed. Because the mask layer 122 is formed in the concave portion 121, crystals do not grow in this portion. Regarding the viewpoint of preventing the crystal growth, the mask layer 122 may be formed from materials other than a $Si_3N_4$ film, and usable examples include dielectric films made of $SiO_2$ or the like, and metals having a high-melting point such as W (tungsten), etc.

In the above process for forming the u-GaN layer 13, a gap arises in the timing when the wing regions 131 come into contact with each other in the regions where the width of the concave portion 121 is larger or smaller. In other words, in the region where the width of the concave portion 121 is small, the adjacent wing regions 131 come into contact with each other faster than in the regions where the width of the concave portion 121 is large. However, even when such differences in timing arise, by suitably selecting the conditions for MOVPE during the formation of the u-GaN layer 13, it is possible to make the surface of the resulting u-GaN layer 13 smooth and flat because of the migration of the supplied source gas over the surface of the crystal.

After forming a u-GaN layer 13 having a thickness of approximately 5 μm according to the process described above on the u-GaN layer 13, a u-GaN layer 14, n-GaN layer 15, u-GaN layer 16, active layer 17 formed of InGaN, p-AlGaN layer 18, and p-GaN 19 are sequentially deposited to form a layered structure as shown in FIG. 3(b). Then, as shown in FIG. 3(c), selective etching is conducted to expose a portion of the n-G aN layer 15, and then, an n-type electrode 24 is formed on the exposed n-G aN layer 15. A gold wire 23 is attached to the n-type electrode 24, by wire bonding via a solder ball 22. In contrast, on substantially the entire surface of the p-GaN layer 19, a transparent p-type electrode 20 is formed. Then, a base electrode 21 is formed and a gold wire 26 is attached by wire bonding via a solder ball 25 to the base electrode 21. Thus, the light emitting diode shown in FIG. 1 is obtained.

Figure 8:
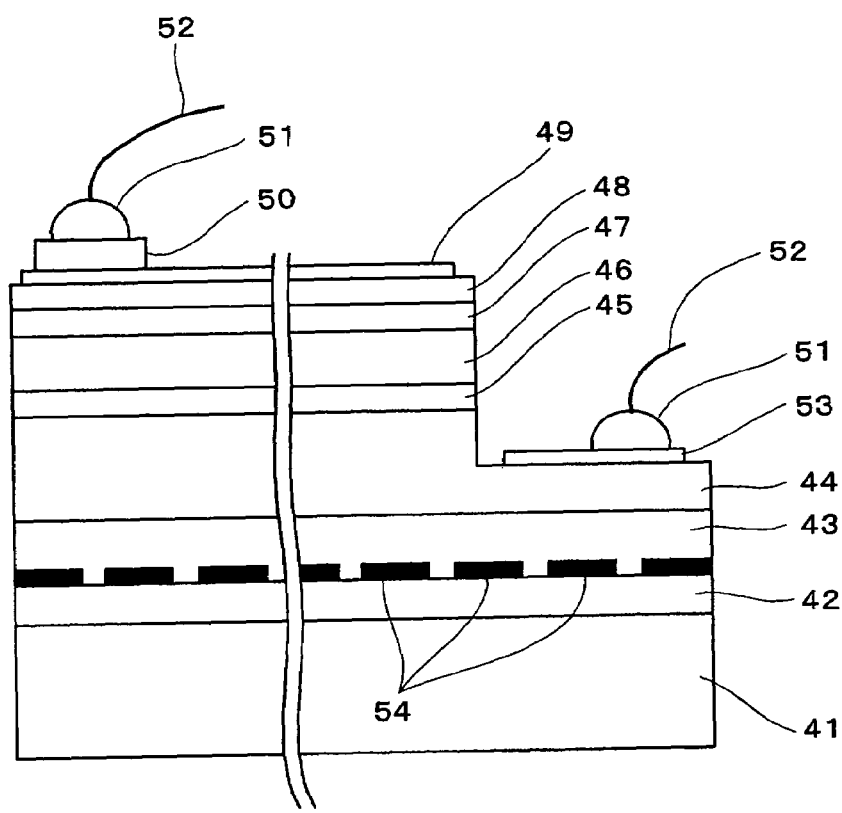
FIG. 8 is a cross-sectional view showing a semiconductor light emitting device of the prior art.
Figure 9:
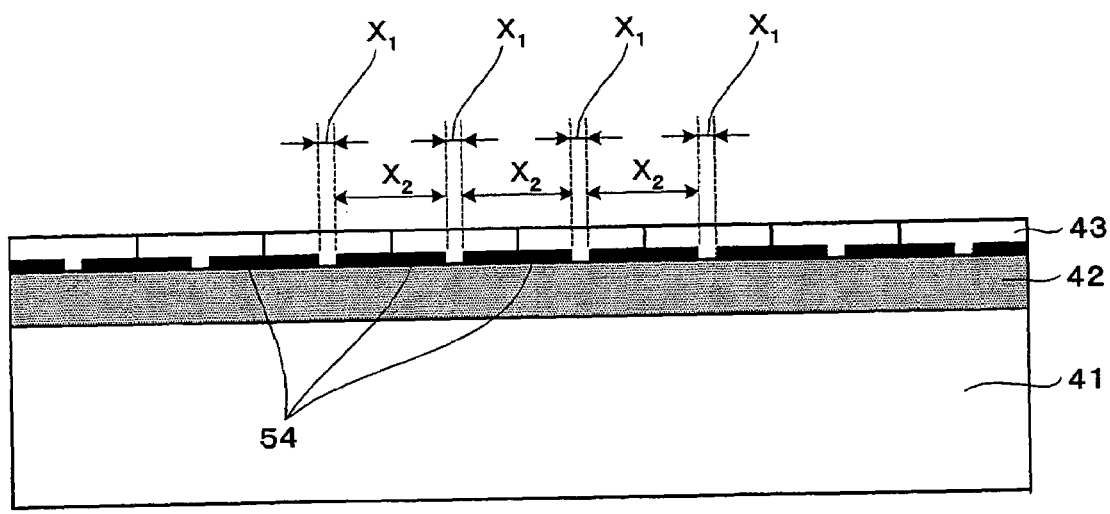
FIG. 9 is a partially enlarged view of FIG. 8 schematically showing the distribution of dislocations in a GaN crystal that has been grown by ELO.

As described above, in the present embodiment, the air layer S is formed between the bottom surface of the u-GaN layer 13, which is formed beneath the active layer 17, and the concave portion 121. The air layer S has a refractive index of 1, and therefore light R transmitted from the active layer 17 in the downward direction (see FIG. 1) is effectively reflected at the interface between the bottom surface of the u-GaN layer 13 and the air layer S. As a result, it is possible to remarkably improve the efficiency of light emission from the device. Comparison between a prior art light emitting device and that of the present embodiment will be made below. In a prior art light emitting device having a structure as shown in FIG. 8, a dielectric mask 54 made of $SiO_2$ is formed beneath a u-GaN layer 43. Because the dielectric mask 54 has a refractive index greater than air, a large portion of light that has been transmitted from active layer 46 passes therethrough and reaches the sapphire substrate 41 so that scattering and absorption of the light occurs. As a result, the light emission efficiency decreases considerably. In contrast, the reflectivity of the interface between the u-GaN layer 13 and air layer S in the present embodiment is twice that of the interface between the u-GaN layer 43 and dielectric mask 54 of the prior art light emitting device, greatly increasing the light emission efficiency. Furthermore, because a high light emission efficiency is achieved, an additional unit for improving reflectivity, such as a Bragg reflector, becomes unnecessary.

Figure 5:
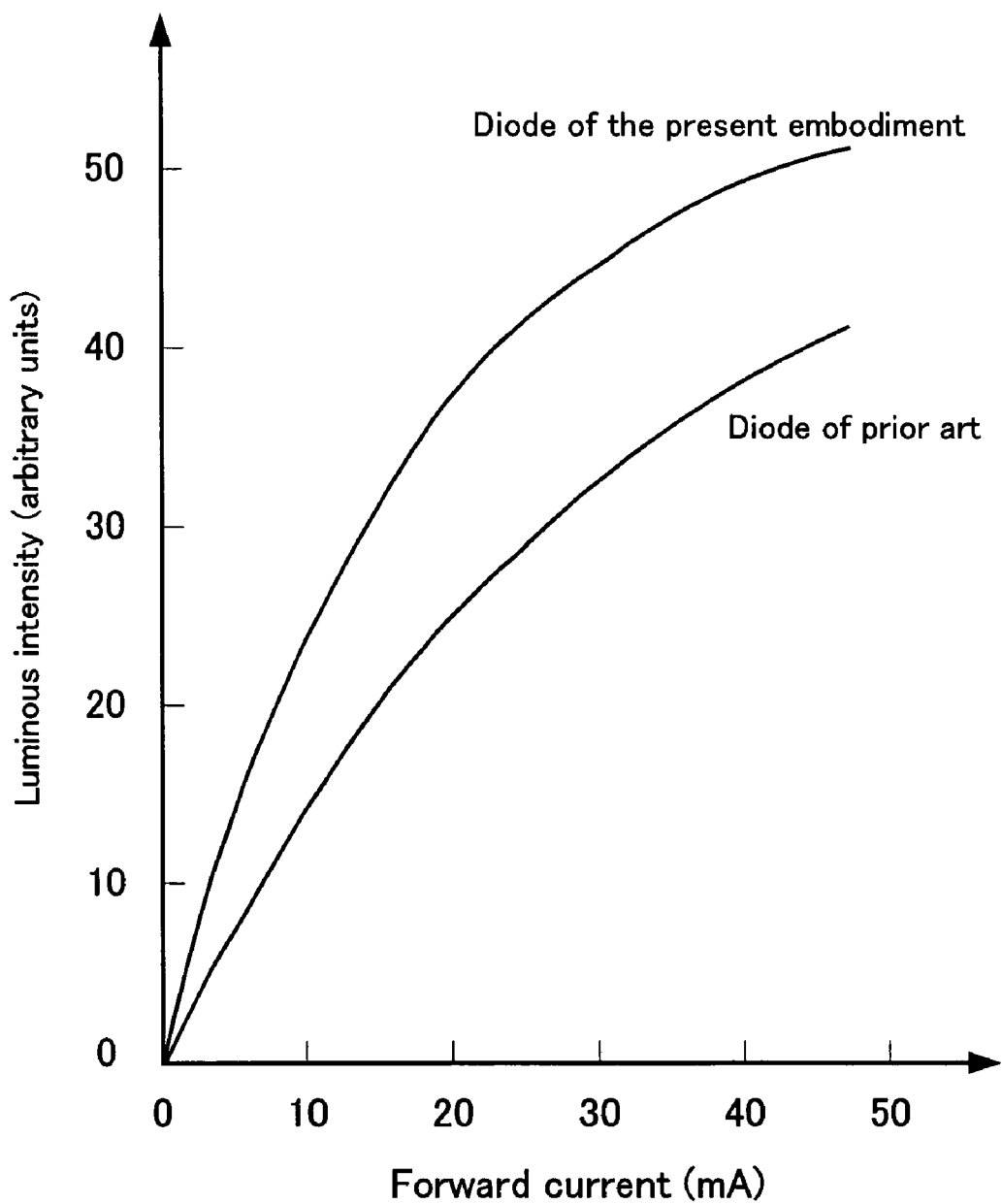
FIG. 5 shows the relationship between the applied current and emission intensity of the semiconductor light emitting device of FIG. 1.

FIG. 5 shows the relationship between the emission intensity and applied current in light emitting diodes of the present embodiment and prior art. As shown in this figure, the light emitting diode of the present embodiment exhibits greater emission intensity at any given applied current, since the light emitted toward the sapphire substrate 11 is efficiently reflected by the air layer S and transmitted outside the device. Another reason why such a high emission intensity is achievable is that, as described below, the u-GaN layer 13 has few crystal defects.

The light emitting diode of the present embodiment can also attain the following effects. As described above, in the light emitting diode of the present embodiment, the width of the concave portion 121 a is made narrower in the portion beneath regions $L_1$ and $L_2$, enhancing the mechanical strength of this portion. Thereby, even when wiring is applied to the base electrode 21 and n-type electrode 24, damage to crystals caused by the impact of the wiring can be prevented. In particular, when the wiring is formed by wire bonding as in the present embodiment, as the wire is continuously held by machine and bonded to the base electrode via the solder ball, the impact of the bonding process greatly affects the crystal structure. Therefore, when such wire bonding is employed, using the structure above is particularly advantageous.

Note that when the width of the concave portion 121 is made narrower, as described above, the width of the air layer S also becomes narrow, rendering a problem in that the enhancement of light emission efficiency cannot be achieved. In addition, when the width of the concave portion 121 becomes narrower, the low-dislocation-region becomes smaller, and this makes it difficult to form a crystal of high quality. This results in the problem of lowered emission intensity. However, since regions $L_1$ and $L_2$ exhibit light shielding properties, emission of light from these regions is not expected. Therefore, even if the reflectivity decreases or crystal defects increase caused by the narrowed width of the concave portions 121 formed beneath these regions, it does not affect the emission intensity and light emission efficiency of the device as a whole.

Furthermore, the light emitting diode of the present embodiment can also achieve the following effects. In the example of the prior art shown in FIG. 8, the dielectric mask 54 is formed so as to make the u-GaN layer 58 grow laterally, and this causes interfacial stress between the dielectric mask 54 and the u-GaN layer 43 growing in the lateral direction. This arises problems in that the orientation of the azimuthal axes in the c-axis crystals becomes irregular (tilt angle of approximately 1°), and additional crystals are unnecessarily formed in areas where the laterally grown GaN regions come into contact with each other.

In contrast, in the light emitting diode of the present embodiment, as shown in FIG. 4, the selectively and laterally grown wing regions 131 are formed in a tress-free condition. Therefore, in wing region 131, irregularity of the orientation of the azimuthal axes in the c-axis crystals is not observed, and connection between wings can be smoothly performed. As a result, formation of additional crystals can be prevented, resulting in a high quality of crystals having a regular orientation. Because crystals of such high quality can be obtained; particularly in light emitting diodes that emit in the ultraviolet light region and have a small percentage of In in the active layer; the luminous efficiency, i.e., emission intensity at a given applied current, can be increased and current leakage can be decreased.

Furthermore, as described above, since crystal defects can be reduced, it is possible to advantageously prevent light scattering and improve emission intensity. The bottom surface of wing region 131, i.e., a face 131a, which is the interface between the wing region 131 and air layer S, is mainly composed of N atoms, and is atomically flat. Therefore, it is possible to effectively reflect light emitted from active layer 17. In contrast, in the prior art device (FIG. 8), the u-GaN layer 43 and dielectric mask 54 come into contact with each other, and therefore it is impossible to obtain a atomically flat surface as described above, decreasing the light reflectivity.

Figure 6:
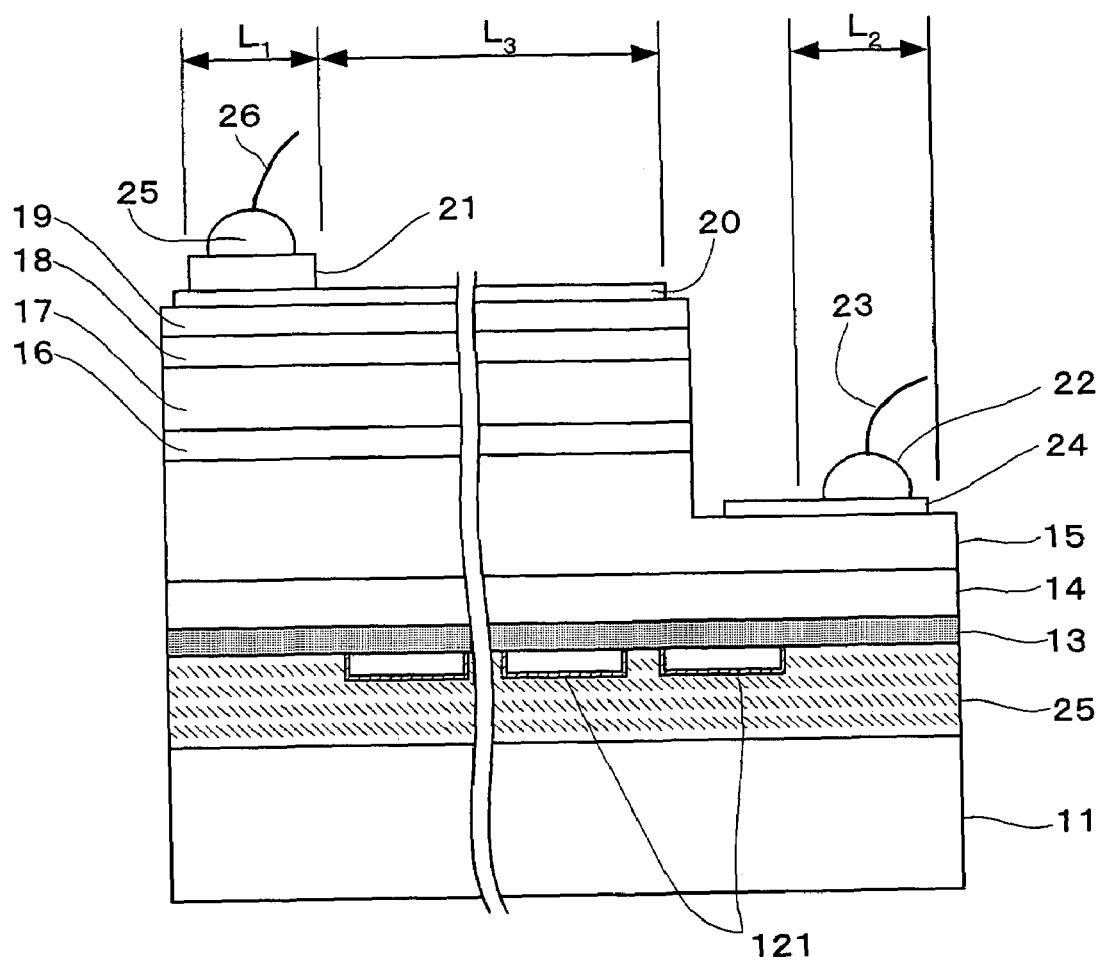
FIG. 6 is a cross-sectional view showing another example of the semiconductor light emitting device of FIG. 1.

One embodiment of the present invention is described above; however, the scope of the present invention is not limited to this embodiment, and modifications may be made in the invention without departing from the spirit and scope thereof. For example, in the embodiment, the width β of the concave portion 121 positioned beneath the region $L_3$ is set to be at least twice that of the concave portions 121 positioned beneath the regions $L_1$ and $L_2$; however, this factor may be made infinite. In other words, as shown in FIG. 6, it is possible to form the concave portion 121 only beneath region $L_3$ and not beneath regions $L_1$ and $L_2$. This structure can greatly improve the mechanical strength of the portions beneath regions $L_1$ and $L_2$. As a result, breakage of crystals during the wiring process, such as wire bonding, can be reliably prevented. This structure has a problem in that the dislocation density of the crystals positioned beneath regions $L_1$ and $L_2$ is increased or the reflectivity thereof decreased; however, as described above, regions $L_1$ and $L_2$ exhibit light shielding properties, and therefore this does not affect the light emission efficiency and luminous efficiency of the device as a whole.

In the above embodiments, the GaN layer is regrown using the GaN layer as seed crystals; however, at least one of the seed crystal layer and regrown layer may be made from mixed crystals containing Al, In, As, P, etc. When such mixed crystals are used, polycrystalline precipitates tend to appear and sometimes the selective growth becomes more difficult compared to the case where GaN is used; however, when the concave portions 121 are formed in the GaN layer that serves as a seed crystal as described above, the precipitates deposit on the concave portions 121, and therefore it is possible to prevent the laterally growing wing regions 131 from coming into contact with the precipitates. As a result, high-quality crystals can be formed and the yield of the device can be enhanced.

In the present embodiment, the GaN layer that becomes a seed crystal is formed by two step growth using a low-temperature buffer layer as an intermediate; however, so long as it is a single crystal that serves as a seed crystal, other methods can be employed. In forming the concave portions in the u-GaN layer, the lift-off process was employed; however, the formation method is not limited to this, so long as it can form a strip-shaped concave portion in the u-GaN layer.

In the present embodiment, a sapphire substrate is used; however, it is possible to compose the substrate from group III-V compound semiconductors, such as GaN or AlGaN.

Furthermore, in the present embodiment, light emission efficiency of the light emitting diode is described; however, the present invention can be applied to a diode that emits white light. A white light-emitting diode emits white light by exciting a fluorescent material that is disposed around the light emitting device using ultraviolet to blue light emitted from the light emitting device. The semiconductor light emitting device of the present invention is usable in such a white light-emitting diode. Employing a semiconductor light emitting device of the present invention increases the luminance and production yield thereof.

In the above embodiments, a surface-emission type semiconductor light emitting device is described in which the p-type electrode serves as an emission detection surface and light is transmitted in the upward direction of the device; however, the present invention can also be employed in a semiconductor light emitting device of a plane-edge type. Hereunder, a plane-edge type semiconductor light emitting device will be explained with referrence to FIG. 7.

Figure 7:
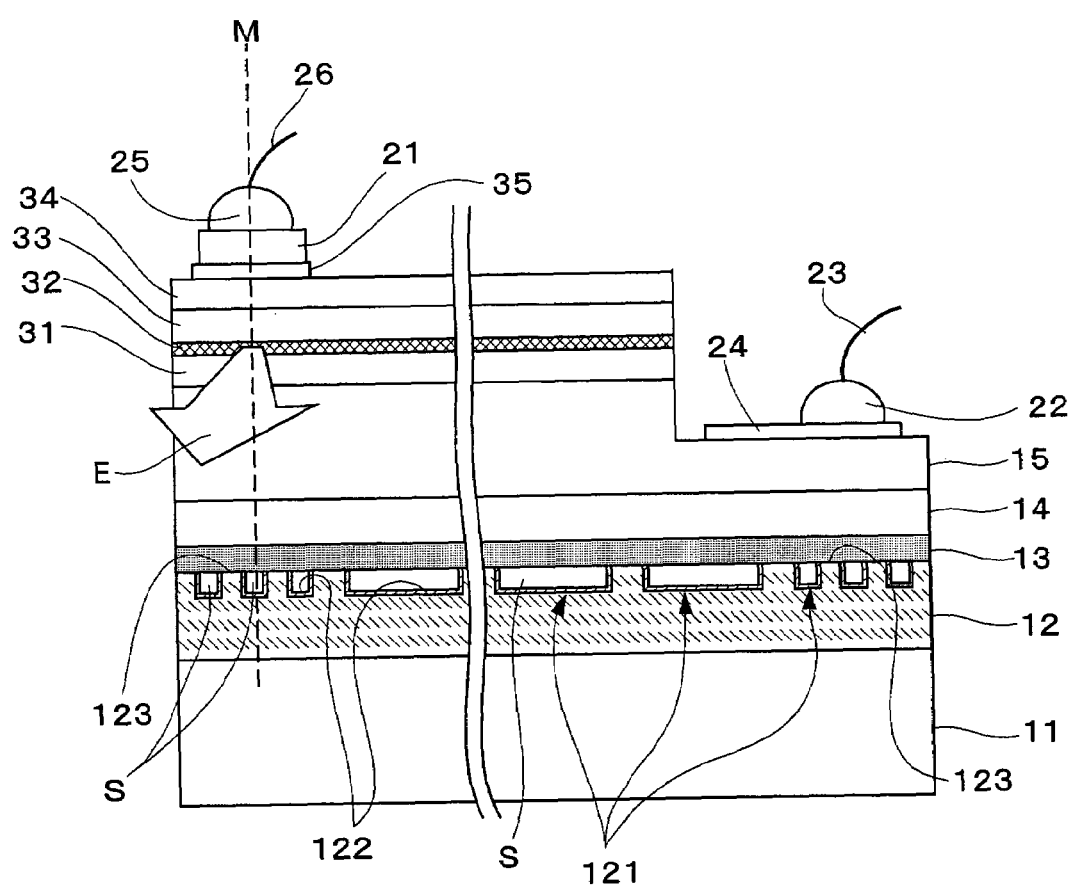
FIG. 7 is a cross-sectional view showing a semiconductor light emitting device according to another embodiment of the present invention.

As shown in FIG. 7, this semiconductor light emitting device performs plane-edge light emission, and therefore the construction of the layered structure is different in the portion above the n-G aN layer 15 from that of the light emitting diode shown in FIG. 1. In other words, as shown in FIG. 7, on the n-G aN layer 15, n-AlGaN layer 31, InGaN layer 32, p-AlGaN layer 33, and p-GaN layer 34 are sequentially formed. Different from FIG. 1, in this light emitting device, p-type electrode 35 is formed on a portion of p-GaN layer 34, and, on top thereof, a base electrode 21, a solder ball 25, and a gold wire 26 are provided. In this structure, as with the light emitting diode shown in FIG. 1, the base electrode 21 is formed over the narrower air layers S.

As the light emitting device performs plane-edge light emission, the thickness of the InGaN layer 32 that serves as an active layer is therefore thin. The n-AlGaN layer 31 and p-AlGaN layer 33 that hold the InGaN layer 32 in between are cladding layers. This causes current blocking, and from the InGaN layer 32, light E will be emitted in the direction perpendicular to the figure drawing plane. In this light emitting device, a current supplying region is disposed direct above the air layer S (on line M in this figure) that is composed of crystals of high quality, and this improves the reliability of the light emitting device.

INDUSTRIAL APPLICABILITY

The present invention provides a semiconductor light emitting device with high efficiency of light emission and high luminous efficiency, and a fabrication method thereof.

The invention claimed is:

1. A semiconductor light emitting device comprising:
   a first GaN based semiconductor layer that has on top thereof a plurality of concave portions formed into a band-like shape with predetermined intervals therebetween;
   a second GaN based semiconductor layer formed on the first GaN based semiconductor layer;
   a layered structure that is formed on the second GaN based semiconductor layer and that comprises an n-type GaN based semiconductor layer, an active layer, and a p-type GaN based semiconductor layer;
   an n-type electrode that is formed on the n-type GaN based semiconductor layer on the portion where the layered structure is partially removed and become exposed; and
   a transparent p-type electrode formed on the p-type GaN based semiconductor layer, wherein
   the p-type electrode serves as an emission detection surface, and
   an air layer is formed between the bottom surface of the second GaN based semiconductor layer and the concave portion.

2. A semiconductor light emitting device according to claim 1, wherein the light emitted from the active layer reflects at the interface between the bottom surface of the second GaN based layer and the air layer.

3. A semiconductor light emitting device according to claim 1, wherein
   light-shielding regions to which wiring is applied are formed on the p-type electrode and n-type electrode; and
   among the plurality of concave portions, the concave portions formed beneath the emission detection surface have a width greater than the concave portions formed beneath the light-shielding regions.

4. A semiconductor light emitting device according to claim 3, wherein the width of the concave portions formed beneath the emission detection surface is at least twice that of the concave portions formed beneath the light-shielding regions.

5. A semiconductor light emitting device according to claim 4, wherein the width of the concave portions formed beneath the emission detection surface is not less than 6 μm and not more than 20 μm.

6. A semiconductor light emitting device according to claim 4, wherein the width of the concave portions formed beneath the light-shielding regions is not less than 1 μm and not more than 6 μm.

7. A semiconductor light emitting device according to claim 4, wherein the width of the projecting portions formed between the concave portions that are formed beneath the light-shielding regions is not less than 1 μm and not more than 6 μm.

8. A semiconductor light emitting device according to claim 3, wherein wire bonding is applied to the light-shielding regions.

* * * * *

UNITED STATES PATENT AND TRADEMARK OFFICE
CERTIFICATE OF CORRECTION

| | |
|---|---|
| PATENT NO. | : 7,030,417 B2 |
| APPLICATION NO. | : 10/633040 |
| DATED | : April 18, 2006 |
| INVENTOR(S) | : Akihiko Ishibashi et al. |

It is certified that error appears in the above-identified patent and that said Letters Patent is hereby corrected as shown below:

Column 2, line 24, change "possible-to" to -- possible to --

Column 7, line 16, after "121", change " a " to -- α --

Signed and Sealed this

Seventeenth Day of April, 2007

JON W. DUDAS
*Director of the United States Patent and Trademark Office*